United States Patent
Bayraktaroglu et al.

(10) Patent No.: US 8,728,861 B2
(45) Date of Patent: May 20, 2014

(54) FABRICATION METHOD FOR ZNO THIN FILM TRANSISTORS USING ETCH-STOP LAYER

(75) Inventors: Burhan Bayraktaroglu, Yellow Springs, OH (US); Kevin Leedy, Dayton, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 190 days.

(21) Appl. No.: 13/271,310

(22) Filed: Oct. 12, 2011

(65) Prior Publication Data

US 2013/0095606 A1   Apr. 18, 2013

(51) Int. Cl.
*H01L 21/00* (2006.01)

(52) U.S. Cl.
USPC .......... 438/104; 438/149; 257/E29.151; 257/E21.002; 257/E29.273; 257/E29.068; 257/E31.003; 257/43; 257/76

(58) Field of Classification Search
USPC .......... 438/104, 149; 257/E29.151, 43, 76, 257/E21.002, E29.273, E29.068, E31.003
See application file for complete search history.

(56) References Cited

U.S. PATENT DOCUMENTS

| | | | |
|---|---|---|---|
| 6,368,960 B1 * | 4/2002 | Hsu et al. | 438/649 |
| 6,548,829 B2 | 4/2003 | Ahn et al. | |
| 6,624,864 B1 * | 9/2003 | Kubo et al. | 349/139 |
| 7,674,662 B2 | 3/2010 | Ye et al. | |
| 2007/0069209 A1 | 3/2007 | Jeong et al. | |
| 2007/0141784 A1 | 6/2007 | Wager, III et al. | |
| 2007/0241327 A1 | 10/2007 | Kim et al. | |
| 2008/0283831 A1 | 11/2008 | Ryu et al. | |
| 2009/0321731 A1 * | 12/2009 | Jeong et al. | 257/43 |
| 2010/0065837 A1 | 3/2010 | Omura et al. | |
| 2010/0140612 A1 | 6/2010 | Omura et al. | |
| 2010/0155792 A1 * | 6/2010 | Ryu et al. | 257/288 |
| 2010/0163861 A1 | 7/2010 | Brazis, Jr. | |
| 2010/0304528 A1 | 12/2010 | Kim et al. | |

OTHER PUBLICATIONS

Carcia et al., "Transparent ZnO thin-film transistor fabricated by rf magnetron sputtering", Applied Physics Letters, vol. 82, No. 7, pp. 1117-1119 (Feb. 17, 2003).

Chiang et al., "High mobility transparent thin-film transistors with amorphous zinc tin oxide channel layer", Applied Physics Letters, vol. 86, 013503, pp. 013503-1-013503-3 (Dec. 23, 2004).

(Continued)

*Primary Examiner* — Thao X Le
*Assistant Examiner* — Matthew Gordon
(74) *Attorney, Agent, or Firm* — AFMCLO/JAZ; Charles Figer, Jr.

(57) ABSTRACT

A method is provided for fabricating a thin film transistor. A plurality of layers is deposited on a substrate. The plurality of layers includes a conductive gate contact layer, a gate insulator layer, an undoped channel layer, an etch-stop layer, and a conductive contact layer. The etch-stop layer is positioned between the conductive contact layer and the undoped channel layer. A portion of the conductive contact layer is selectively removed while removal of a portion of the undoped channel layer is prevented by the etch-stop layer during the selective removal. A portion of the etch-stop layer is selectively removed and an exposed portion of the etch-stop layer is converted from a conductor to an insulator by oxidizing the exposed portion of the etch-stop layer in air. A portion of remaining layers of the plurality of layers is selectively removed to form the thin film transistor.

20 Claims, 11 Drawing Sheets

(56) References Cited

OTHER PUBLICATIONS

Bayraktaroglu et al., "High-Frequency ZnO Thin-Film Transistors on Si Substrates", IEEE Electron Device Letters, vol. 30, No. 9, pp. 946-948 (Jul. 28, 2009).

Masuda et al., "Transparent thin film transistors using ZnO as an active channel layer and their electrical properties", Journal of Applied Physics, vol. 93, No. 3, pp. 1624-1630 (Feb. 1, 2003).

Nomura et al., "Room-temperature fabrication of transparent flexible thin-film transistors using amorphous oxide semiconductors", Letters to Nature, vol. 432, pp. 488-492 (Nov. 25, 2004).

Özgür et al., "A comprehensive review of ZnO materials and devices", Journal of Applied Physics, vol. 98, 041301, pp. 041301-1-041301-103 (Aug. 30, 2005).

Bayraktaroglu et al., "Nanocrystalline ZnO Microwave Thin Film Transistors", Proceedings of SPIE, vol. 7679, 767904, pp. 767904-1-767904-12 (Apr. 5, 2010).

\* cited by examiner

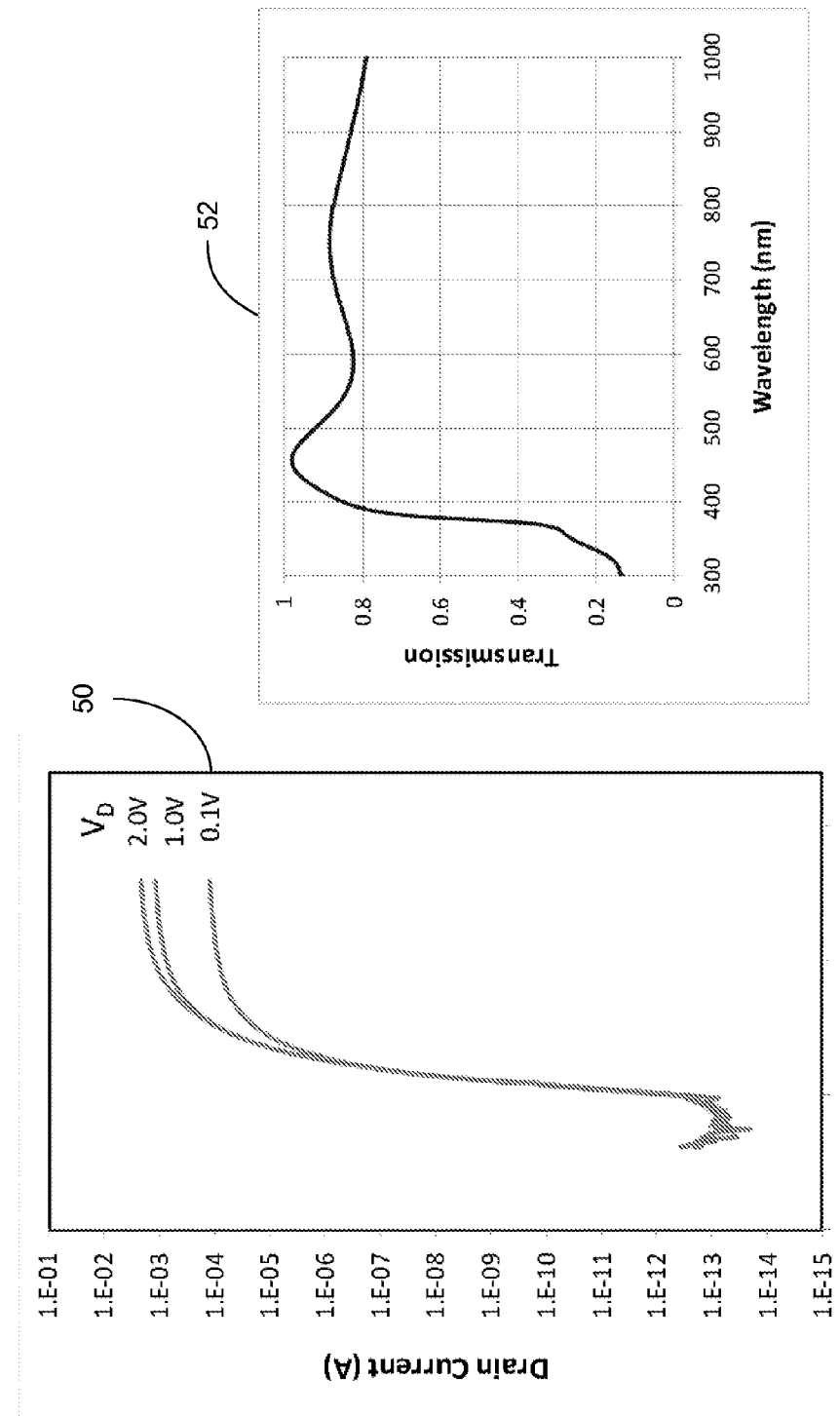

FABRICATION METHOD FOR ZNO THIN FILM TRANSISTORS USING ETCH-STOP LAYER

RIGHTS OF THE GOVERNMENT

The invention described herein may be manufactured and used by or for the Government of the United States for all governmental purposes without the payment of any royalty.

FIELD OF THE INVENTION

The present invention relates to methods for forming transistors, and more particularly to methods for forming thin film transistors.

BACKGROUND OF THE INVENTION

Thin film transistors (TFT) are the basic building blocks of large area electronic circuits such as those used in the backplanes of active matrix liquid crystal displays (AMLCD) of the type often used in flat panel monitors and televisions. In these applications, TFT circuits are used to control the activation of pixels that make up the display. Thin film circuits may be produced over non-planar surfaces. They may be fabricated on flexible substrates. And, in some applications, they may be required to be optically transparent to the visible light. Because of these unique application-specific requirements conventional transistors made on single crystal substrates cannot generally be used.

Historically, TFTs have been made from amorphous silicon (a-Si) films to satisfy the unique requirements of the applications described above, rather than the single crystal Si typically used with conventional electronic circuits such as microprocessor circuits of modern computers. Transistors made from a-Si, however, suffer from a number of deficiencies including low electron mobility, light sensitivity operation, limited switching ratios, and poor threshold voltage uniformity. These deficiencies make a-Si TFTs unsuitable for contemporary display circuit applications that demand higher switching speeds and accuracy.

In recent years, metal-oxide semiconductors have been considered good candidates for display electronics applications. In particular, for thin film applications, several semiconductors (Zn, In, Sn, Ga, and Hf) containing metal-oxides have shown good promise. One of the most promising metal-oxide semiconductors for thin film and transparent transistor applications is ZnO, which is transparent because of its wide band gap (3.4 eV), has high thin film electron mobility, and can be easily prepared by several deposition techniques. ZnO thin film transistors have also been shown to be suitable for high performance circuit applications beyond display electronics because of their superior electronic properties. Some of these applications include microwave signal amplification, switching and mixing, high speed logic circuits and high speed control electronics. Other metal-oxide based thin film semiconductors are mostly useful when they are a mixed combination of several metal-oxides. For example, indium zinc oxide (IZO) or indium zinc gallium oxide (IGZO) are ternary and quarternary compound semiconductors whose exact composition must be carefully controlled in manufacturing. On the other hand, ZnO is a simple binary compound and its composition may be readily controlled in a manufacturing environment. This contributes to ZnO-based circuits being both high in performance and low in manufacturing cost.

In a transparent transistor, all layers used in the construction of the transistor must be highly transparent, meaning that the optical transparency of each layer must be better than 90 percent. When ZnO is used as the building material for transparent transistors, the transparency requirement can be easily met. In a transparent ZnO transistor, all the contact layers are made of doped ZnO layers, whereas the channel layer is made of undoped ZnO. ZnO can be doped with small amounts of Al or Ga during the film growth. In a ZnO thin film field effect transistor, the gate insulator may be made from a wide range of insulating films such as silicon dioxide, aluminum oxide, hafnium oxide, etc. These films have very large bandgaps and therefore are also highly transparent. ZnO transparent thin film transistors (TTFT) are typically fabricated with gate contact at the bottom, i.e., bottom gate structure. They can also be fabricated with the gate contact on the top, .i.e., top gate structure. For simplicity, bottom gate structures will be discussed, though any of the innovations may also be applied equally well to top gate type transistors.

In a bottom gate TTFT 10, as shown schematically in FIG. 1, the first layer to be fabricated on a transparent substrate 12 is the conductive gate layer 14. Other layers are fabricated over this layer in sequence during fabrication, namely gate insulator layer 16, channel layer 18, and source 20 and drain 22. Unwanted portions of each layer are removed by etching while protecting the portions of the layer with protective films such as photoresist. A major difficulty in ZnO TTFT manufacturing is the fabrication of the source 20 and drain 22 contacts over the undoped channel layer 18. Compositionally, these two layers are almost identical and therefore have almost identical etch rates in chemical etchants such as diluted acids. It is therefore not possible to selectively remove the portion of the top doped ZnO layer to fabricate source 20 and drain 22 contacts without destroying the underlying undoped channel layer 18.

Because of etch non-selectivity between the top conductive layer and the undoped channel layer, a common fabrication approach is to make use of physical masks, typically made of thin metal layers, to shield the portion of the surface during layer deposition where separation between source and drain contacts is desired. This method has several drawbacks including the exposure of the undoped channel ZnO layer to atmosphere to facilitate the placement of the physical mask on the wafer. Contamination of surface layer degrades the interface between the doped and undoped layers and results in inferior devices. Second, the physical mask layer fabrication has severe limitations in the feature sizes that can be used. Instead of the desired dimensions on the order of micrometers, this method is only capable of producing devices with feature sizes of millimeters. Additionally, placement accuracy of the physical mask over the wafer is not well controlled, which may result in gross errors in registering contact layers with respect to each other.

A method of overcoming this problem was described in U.S. Publication Numbers 2010/0304528 A1 and 2010/0065837 A1. According to the method described, a protective insulating layer is produced over the undoped channel layer first. Portions of this layer are removed in a dry etch process without removing the underlying undoped ZnO channel layer. Doped contact layers are produced over the protective layer and allowed to make contact with the undoped channel layer in the regions where the protective layer was previously removed by dry etching. However, the dry etch process causes damage to the undoped channel layer, which must be repaired by high temperature annealing.

What is needed in the art, therefore, is a method of fabricating thin film transistors without the drawbacks or difficulties associated with contemporary fabrication methods.

SUMMARY OF THE INVENTION

Embodiments of the invention assist in overcoming the difficulties associated with contemporary fabrication methods by providing a method of fabricating thin film transistors. A plurality of layers is deposited on a substrate, with the plurality of layers including a conductive gate contact layer, a gate insulator layer, an undoped channel layer, an etch-stop layer, and a conductive contact layer. The etch-stop layer is positioned between the conductive contact layer and the undoped channel layer. A portion of the conductive contact layer is selectively removed. The etch-stop layer prevents removal of any of the undoped channel layer during the selective removal of the portion of the conductive contact layer. A portion of the etch-stop layer is selectively removed and any remaining, exposed portion of the etch-stop layer is converted from a conductor to an insulator by oxidizing the exposed portion in air. Portions of the remaining layers of the plurality of layers are selectively removed to form the thin film transistor.

In some embodiments, the conductive contact layer and the undoped channel layer may include a semiconductor such as Zn, In, Sn, Ga, or Hf containing metal-oxides. In some embodiments, the etch-stop layer may include a metal such as Ti, Al, Cr, Si, Zr, Hf, or Ni.

In some embodiments, selectively removing the portion of the conductive contact layer may include applying a masking layer to the plurality of layers deposited on the substrate and etching the conductive contact layer in a wet chemical etch solution. In a particular embodiment, the wet chemical etch solution includes hydrochloric acid and water. In some embodiments, selectively removing the portion of the etch-stop layer may include etching the etch-stop layer by reactive ion etching in a mixture of $CF_4$ and $O_2$ gasses.

In some embodiments, converting the exposed portion of the etch-stop layer may further include annealing the exposed portion of the etch-stop layer in air or oxygen at an elevated temperature. In one embodiment, the elevated temperature may include temperatures up to approximately 200° C. In another embodiment, the elevated temperature may include temperatures up to approximately 400° C.

In an alternate embodiment of a method for fabricating a reduced parasitic capacitance transistor, a conductive gate contact layer is deposited on a substrate. A portion of the conductive gate contact layer may then be selectively removed leaving an etched gate contact layer. A plurality of layers is then deposited on the substrate and the etched gate contact layer, with the plurality of layers including, a gate insulator layer, an undoped channel layer, an etch-stop layer, and a conductive contact layer. The etch-stop layer is positioned between the conductive contact layer and the undoped channel layer. A portion of the conductive contact layer is selectively removed. The etch-stop layer prevents removal of any of the undoped channel layer during the selective removal of the portion of the conductive contact layer. A portion of the etch-stop layer is selectively removed and any remaining, exposed portion of the etch-stop layer is converted from a conductor to an insulator by oxidizing the exposed portion in air. Portions of the remaining layers of the plurality of layers are selectively removed to form the thin film transistor.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIG. 6A is a graph showing the transfer characteristics of ZnO TTFT fabricated according to embodiments of the invention.

FIG. 6B is a graph showing to optical transparency of the film stack, including the etch-stop layer, used in the fabrication of the ZnO TTFT.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Embodiments of the invention are related to the fabrication of thin film transistors, some of which are ZnO-based, used in transparent, conformal or flexible electronic circuits. The embodiments provide a method of fabrication that enables the use of highly conductive ZnO layers as source and drain contacts of a transparent transistor or as the contact layers of non-transparent transistors. The fabrication method enables the selective removal of the conductive ZnO layer during fabrication without destroying the channel ZnO layer. A thin layer of oxidizable metal placed between the conductive and channel ZnO layers protects the channel ZnO layer while the top conductive ZnO layer is removed during a chemical etching process. This "etch-stop" layer is then allowed to oxidize during fabrication, becoming non-conductive, and therefore may be left in place after processing without interfering with the operation of the transistor. The etch-stop layer may also be selectively removed from the exposed surface areas if desired. The etch-stop layer is thin enough that it does not impact the transistor operation yet it is thick enough to provide protection to underlying ZnO layer during the chemical etch process. Embodiments of this invention enable the use of high performance ZnO films for both the channel and the contact layers of transistors. More specifically, the method described in conjunction with the embodiments of the invention enables the fabrication of all ZnO-based thin film transistors without the need for compositional variations by adding, for example, In, Ga, Hf, etc. into the composition of some of the layers to provided etch selectivity.

Figure 1:
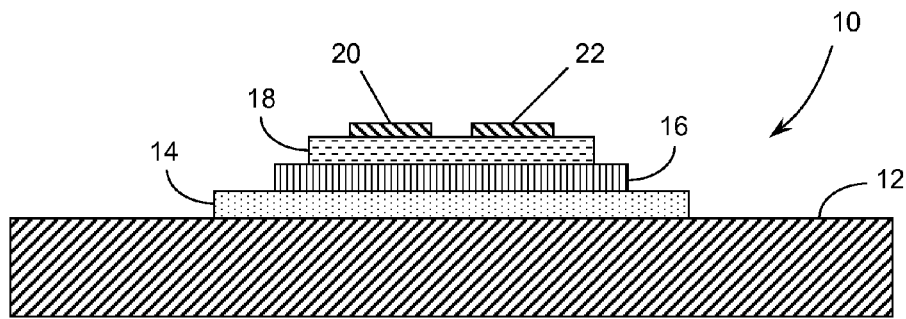
FIG. 1 is a schematic diagram of a transparent thin film transistor.
Figure 2:
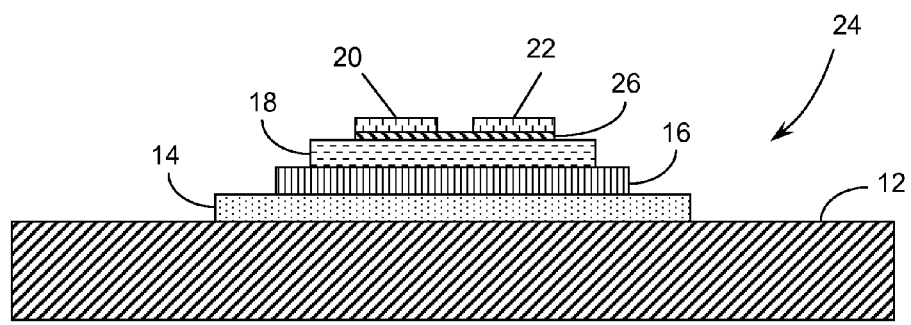
FIG. 2 is a schematic diagram of a transparent ZnO thin film transistor with etch-stop layer between conductive contact and undoped channel ZnO layers.
Figure 3:
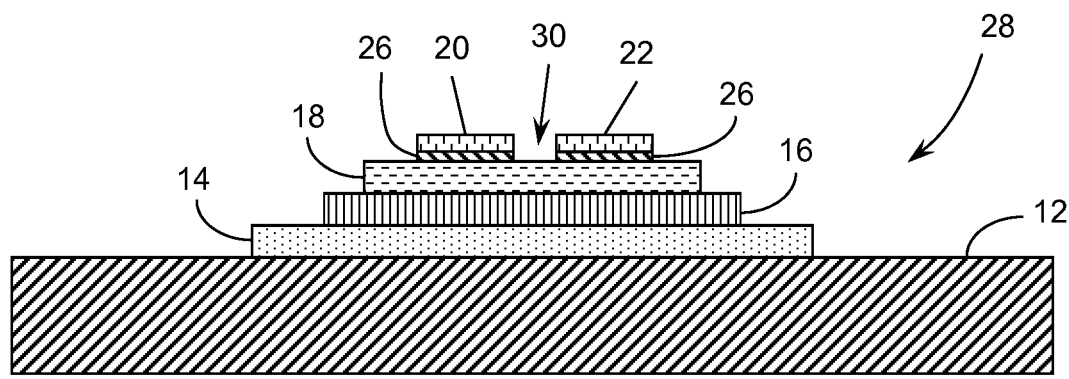
FIG. 3 is a schematic diagram of the transparent ZnO thin film transistor of FIG. 2 with etch-stop layer removed between source and drain contacts.

Embodiments of the invention assist in overcoming the problems associated with the fabrication of source 20 and drain 22 contacts of a ZnO TTFT 24 by inserting a thin layer of metal, an etch stop layer 26, between the conductive contact layer and the undoped channel layer 18, as illustrated in FIG. 2. The type of metal and its thickness is chosen such that the etch stop layer 26 is able to protect the underlying undoped channel layer 18 while the conductive contact layer above it is being removed in chemical etchants. The metal is of a type that readily oxidizes to become an insulator at low temperatures so that at the end of the process, the exposed parts of the etch-stop metal turn into an insulator. This insulating layer may then serve as a protective layer over the channel and does not interfere with the channel conduction mechanism. The metal sandwiched between the conductive contact layer and the undoped channel layer 18 in the areas corresponding to the source 20 and drain 22 contacts assists in improving the vertical conduction by lowering the potential barriers between these two ZnO layers. Metals suitable for this purpose may include, but are not limited to, Ti, Al, Cr, Si, Zr, Hf, Ni, etc. The etch-stop layer must be thick enough to protect the underlying ZnO layer 18. Simultaneously, the etch stop layer must be thin enough that it completely oxidizes when exposed to atmosphere at room temperature or at temperatures up to 200° C. The optimum thickness will depend on the choice of metal. For a titanium (Ti) etch-stop layer, for example, an optimum thickness was determined by experiments to be approximately 3.5 nm. It was found that thinner layers did not provide adequate protection for the channel ZnO layer 18 during the removal of the contact layers. Thicker layers did not oxidize completely and therefore resulted in a conductive layer over the channel region of the transistor. Such conductive layers prevent the device from turning off and degrade the switching capabilities of the transistor. In a particular embodiment of the invention, TTFT 28, the etch-stop layer 26 exposed in the gap 30 after removing the top conductive contact layer may be removed using a short dry etch process known in the art without etching the undoped channel ZnO layer 18, as illustrated in FIG. 3.

Figure 4:
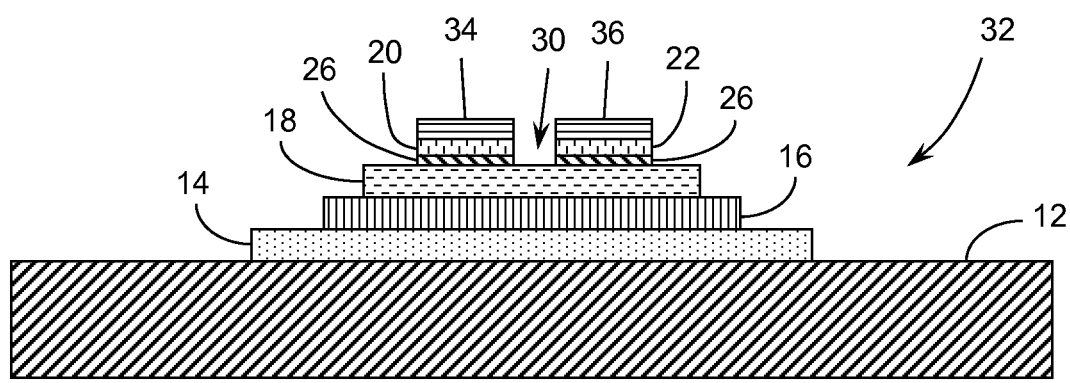
FIG. 4 is a schematic diagram of a non-transparent ZnO thin film transistor with metal source, drain and gate contacts.

In an alternate embodiment of the invention, the etch-stop layer 26 may be used in the fabrication of a non-transparent ZnO thin film transistor 32, as shown in FIG. 4. In this embodiment, metal contact layers may be fabricated over the conductive ZnO layer. The metal contact layers are used as protective layers during the removal of the contact layer. The etch stop layer facilitates the complete removal of the contact layer between the metal source 34 and drain 36 contacts, as with the embodiments discussed above. Although non-transparent ZnO TFTs may be fabricated without contact layers under the source 34 and drain 36 metals electrodes, the use of highly conductive layer between the metal and the undoped channel ZnO layer 18 assists in lowering the contact resistance for higher transistor performance.

Figure 5A:
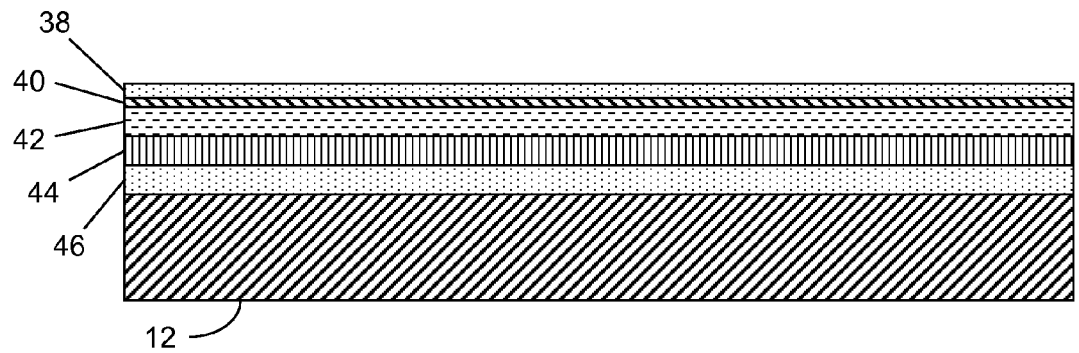
FIGS. 5A-5E are schematic diagrams of stages of a transparent ZnO thin film transistor fabrication with etch-stop layer.

Turning now to the fabrication process, FIGS. 5A-E illustrate selected steps of a fabrication of a TTFT. As shown in FIG. 5A, all layers necessary for the fabrication of ZnO TTFT are deposited on a transparent substrate 12. These layers may include conductive ZnO layer 46 for gate contact, gate insulator 44, undoped ZnO channel layer 42, etch-stop layer 40, and conductive ZnO contact layer 38. There are numerous advantages to depositing all layers at the beginning of fabrication. First, the manufacturing is simplified by having all layers deposited in as few deposition runs as possible. Using contemporary thin film deposition techniques, it may be possible to deposit all layers sequentially in the same deposition chamber. Second, the interfaces between the layers may be atomically clean if layers are fabricated in the same deposition run. The interface quality may still be preserved if the depositions for various layers are done in different tools, because no processing steps are applied to the surface of deposited layers. The processing steps may include photoresist protective layer deposition, developing, and subsequent removal of the photoresist layer in chemical solutions. Such chemicals may alter the surface chemistry of deposited layers and degrade the quality of interface between the layers. Layers may be deposited at room temperature or at elevated temperatures depending on the temperature tolerance of the substrate and the desired quality of the films. If the substrate is made from organic compounds such as polyimide for flexible electronic application, for example, the temperature budget for layer deposition may be limited to approximately 200° C. However, if the substrate is made from glass or quartz or similar transparent substances, the deposition temperature may be as high as approximately 400° C.

Figure 5B:
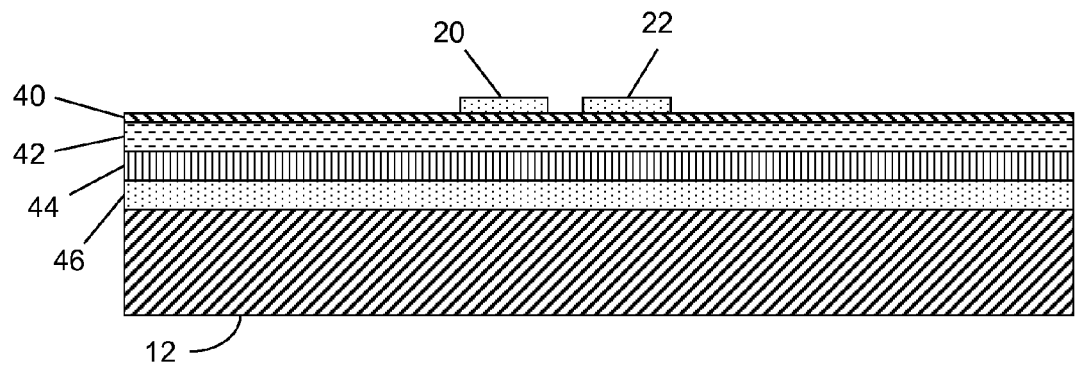

After the layers are deposited, a masking layer, such as photoresist film which is commonly used in the art, is applied to the top surface of the substrate 12 and patterned to define the source 20 and drain 22 contact layers of the transistor. The portions of the conductive ZnO layer 38 that are not masked are etched in wet chemical solutions or in dry plasma reactors. For chemical etching, a dilute solution of hydrochloric acid can be used in some embodiments. Dilute solutions of other acids may also be used for this purpose provided that the etch-stop layer 40 is not soluble in the etchant. In a 1:1000 ratio of hydrochloric acid to water, the etchant removes the conductive ZnO contact layer in about 30 seconds and does not etch the etch-stop layer 40 as shown in FIG. 5B.

Figure 5C:
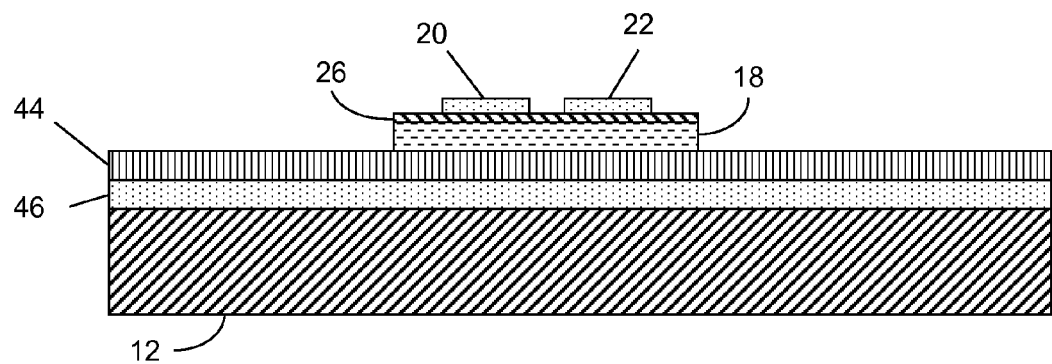
Figure 5D:
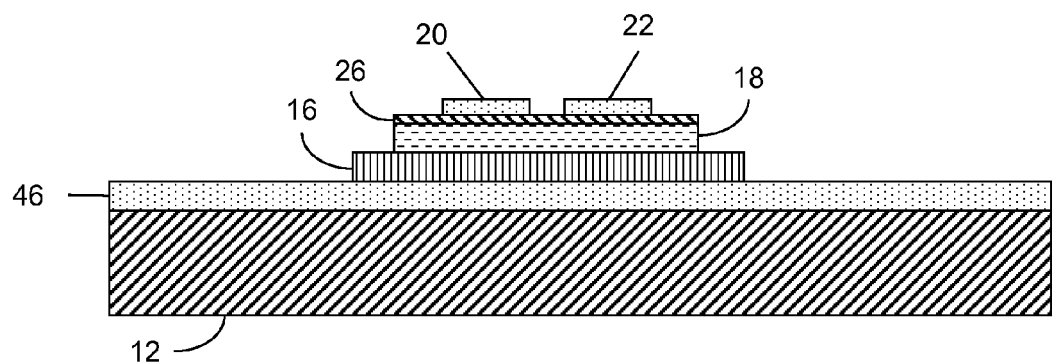

A similar photoresist masking approach may be used to protect the areas of undoped ZnO channel layer 42 and the etch-stop layer 40 above it. First the etch-stop layer 40 is selectively removed. This may be accomplished by reactive ion etching in a mixture of $CF_4$ and $O_2$ gasses in some embodiments. Second, the undoped ZnO channel layer 42 is etched as shown in FIG. 5C. The photoresist masking method is used once more to protect areas of the conductive ZnO layer 46 and unprotected areas are removed. In some embodiments, the etching may be accomplished with the use of a diluted HCl solution, as set forth above and as shown in FIG. 5D.

Figure 5E:
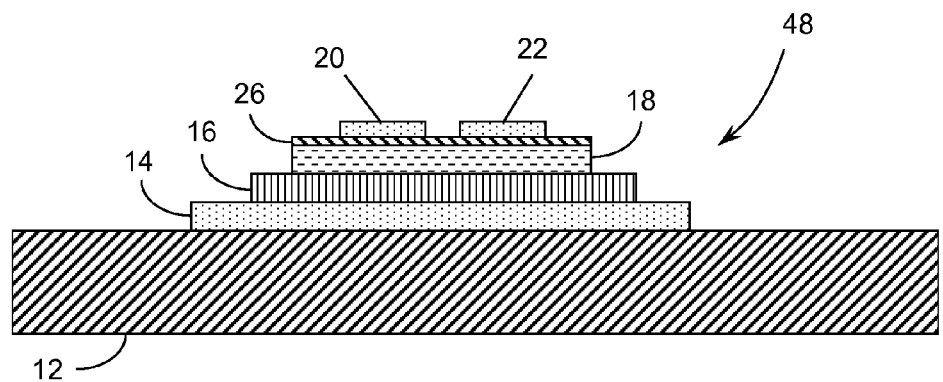

The etch-stop layer 26 between the source 20 and drain 22 contacts in FIG. 5E is converted to an insulator during the processing through oxidation in air. If oxidation is not complete and some electrical conduction occurs between the source 20 and drain 22 electrodes, the substrate 12 may be annealed in air or oxygen at temperatures up to 200° C. to complete the oxidation process. The extent of further oxidation, which may be required at the end of processing, depends on the nature of the metal used as the etch-stop layer 26 and its thickness. In a particular embodiment where approximately 3.5 nm of Ti is used as the etch-stop layer, oxidation was usually completed by the end of processing and further annealing was not normally required.

Graph 50 in FIG. 6A shows the transfer characteristics of a transparent transistor fabricated on a substrate 12 consisting of a quartz wafer. As seen in the graph 50, the transistor is able to turn on and off with applied gate bias voltage and on/off ratios of better than $10^{10}$ is obtainable. The optical transparency of the film stack is shown in graph 52 in FIG. 6B. The film stack itself, not including the quartz substrate 12, shows about 90 percent average transparency in the visible spectrum.

Figure 7A:
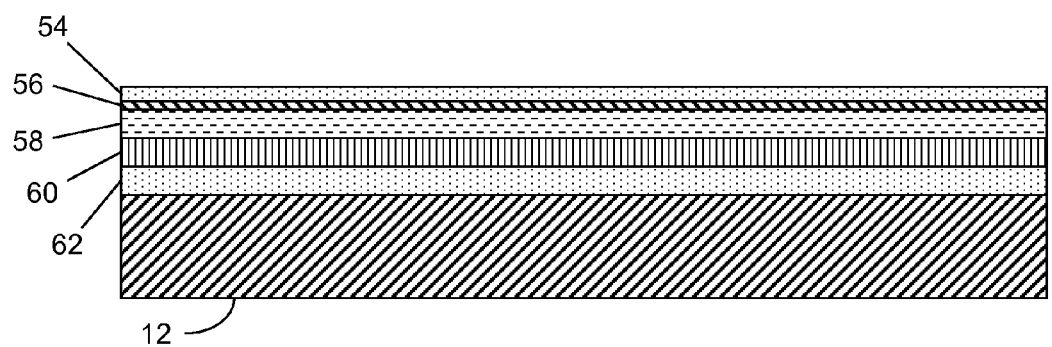
FIGS. 7A-7F are schematic diagrams of stages of an alternate transparent ZnO thin film transistor fabrication with etch-stop layer.

Depending on the choice of etch stop metal and its thickness, it is possible that incomplete oxidation of the exposed surface of the etch stop layer after fabrication may result in leakage currents between source and drain contacts. Such leakage current may increase the transistor off-state current and therefore reduce the on/off ratio. In such cases, the etch-stop layer in the exposed surface area can be removed during device processing. Turning now to the fabrication process for this embodiment, FIGS. 7A-F illustrate selected steps of a fabrication of a TTFT. As shown in FIG. 7A, all layers necessary for the fabrication of ZnO TTFT may again be deposited on a transparent substrate 12. These layers may include conductive ZnO layer 62 for gate contact, gate insulator 60, undoped ZnO channel layer 58, etch-stop layer 56, and conductive ZnO contact layer 54. Layers may be deposited at room temperature or at elevated temperatures depending on the temperature tolerance of the substrate and the desired quality of the films. If the substrate is made from organic compounds such as polyimide for flexible electronic application, for example, the temperature budget for layer deposition may again be limited to approximately 200° C. However, if the substrate is made from glass or quartz or similar transparent substances, the deposition temperature may again be as high as approximately 400° C.

Figure 7B:
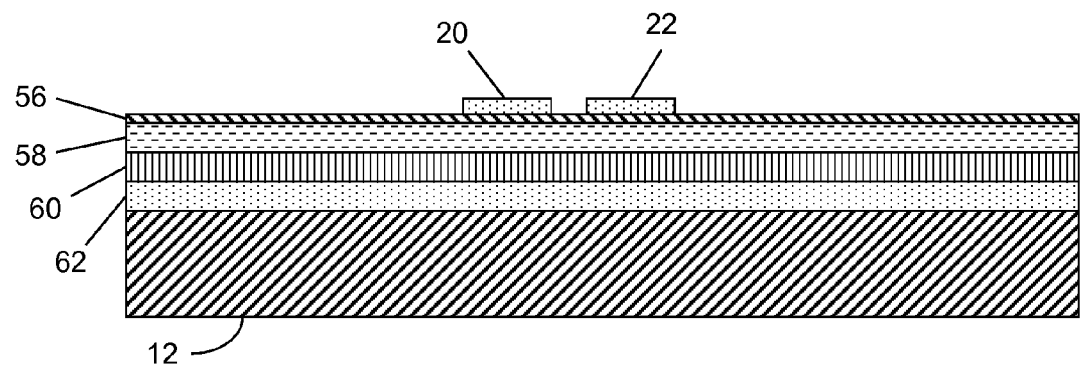
Figure 7C:
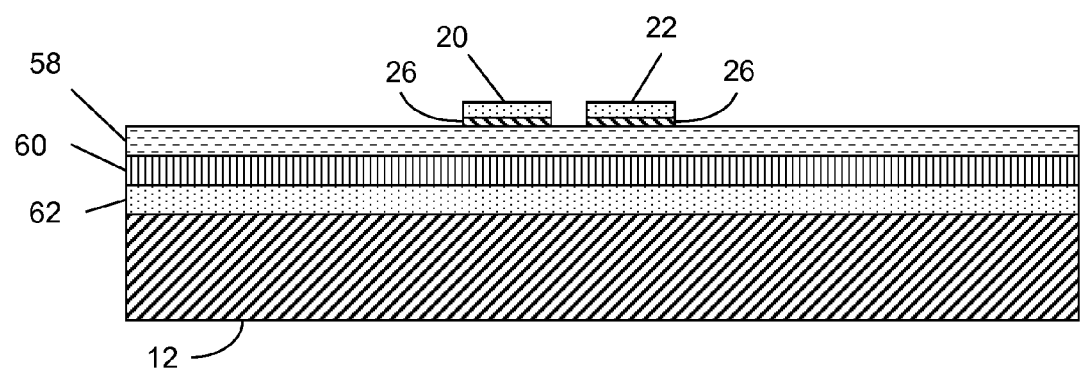

After the layers are deposited, a masking layer, such as photoresist film, which is commonly used in the art, is applied to the top surface of the substrate 12 and patterned to define the source 20 and drain 22 contact layers of the transistor. The portions of the conductive ZnO layer 54 that are not masked are etched in wet chemical solutions or in dry plasma reactors. For chemical etching, a dilute solution of hydrochloric acid may again be used in some embodiments. Dilute solutions of other acids may also be used for this purpose provided that the etch-stop layer 56 is not soluble in the etchant. The etchant removes the conductive ZnO contact layer 54 in about 30 seconds and does not etch the etch-stop layer 56 as shown in FIG. 7B.

Figure 7D:
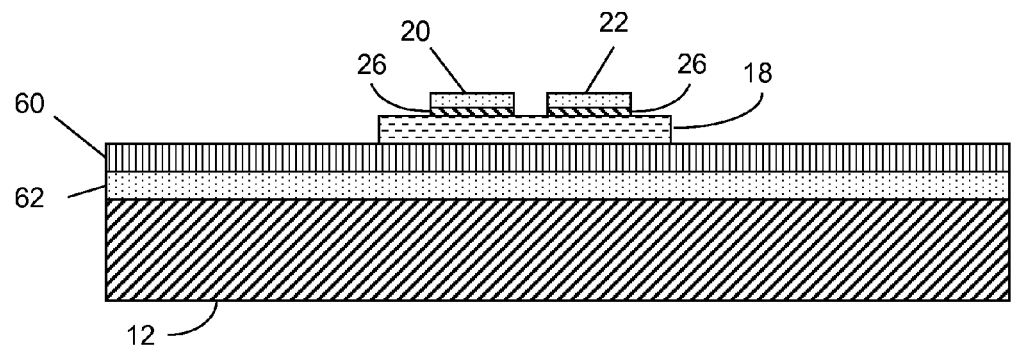
Figure 7E:
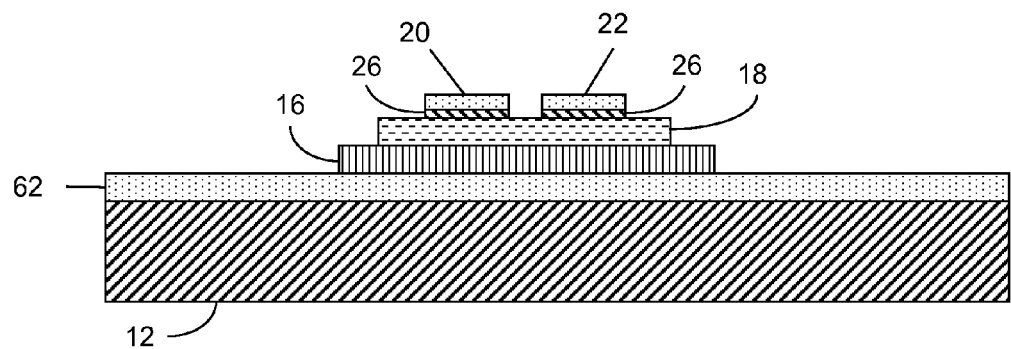
Figure 7F:
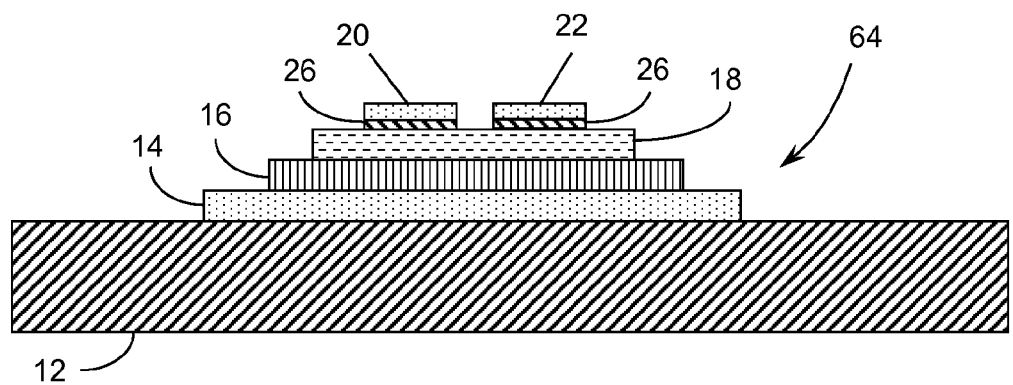

The photoresist masking layer used to fabricate source 20 and drain 22 contacts is further utilized to protect these contacts during the removal of the etch-stop layer 56, including the portion of the etch-stop layer between the source 20 and drain 22. This again may be accomplished by reactive ion etching in a mixture of $CF_4$ and $O_2$ gasses in some embodiments and shown in FIG. 7C. A similar photoresist masking approach may be used to protect the areas of undoped ZnO channel layer 58, which is then etched as shown in FIG. 7D. The photoresist masking method is used once more to protect areas of the conductive ZnO layer 62, and unprotected areas are removed as shown in FIG. 7E. The etch-stop layer 26 between the source 20 and drain 22 contacts in FIG. 7F does not need to oxidize. The removal of the etch-stop layer 26 between the source 20 and drain 22 contacts eliminates any alternate conductive paths.

Figure 8A:
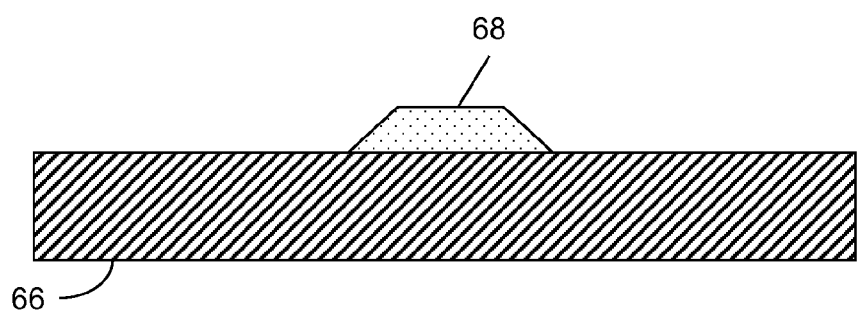
FIGS. 8A-8D are schematic diagrams of small gate electrode transparent ZnO transparent thin film transistor fabrication with etch-stop layer.
Figure 8B:
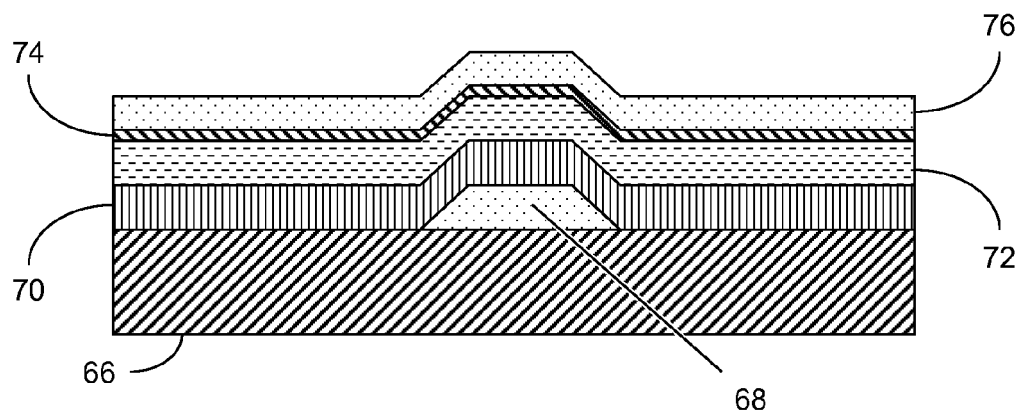
Figure 8C:
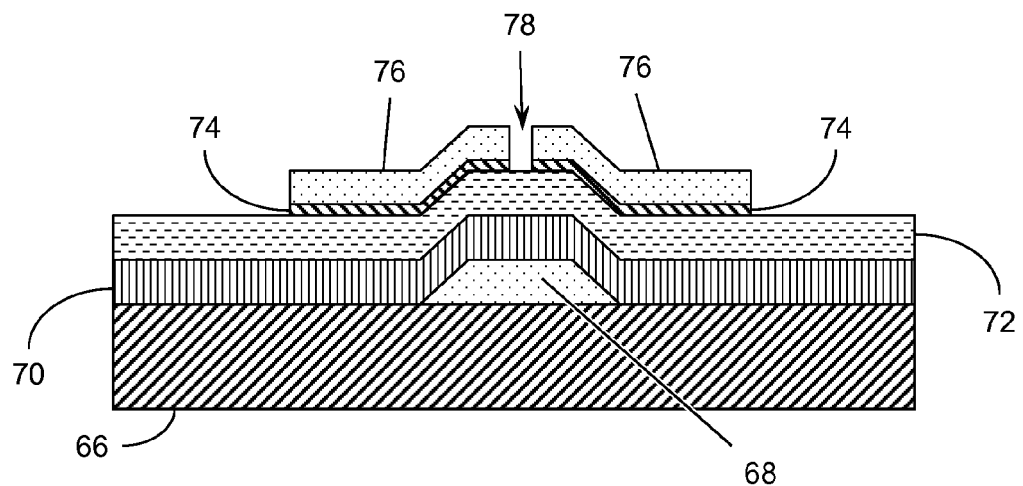
Figure 8D:
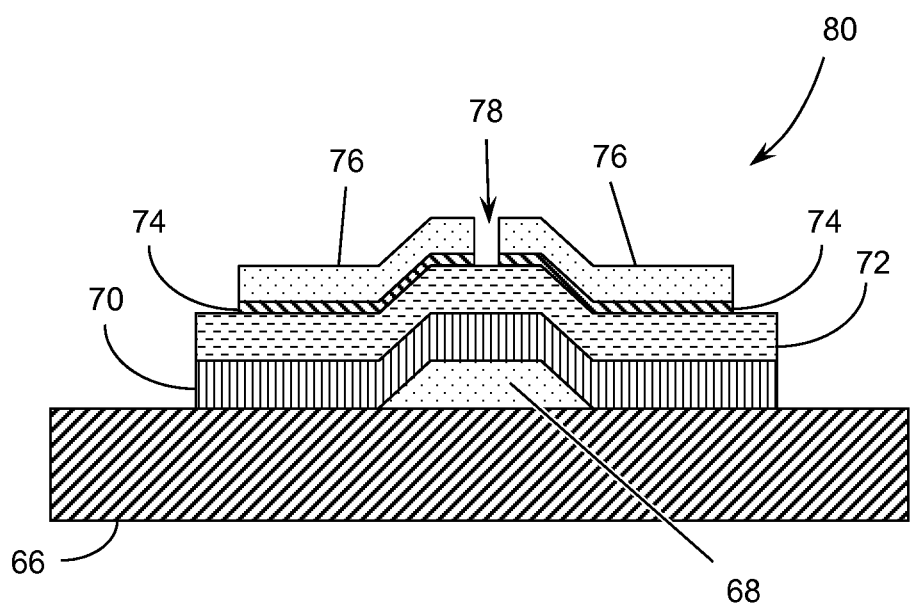

The method used in embodiments of the invention is also compatible with fabrication of TTFTs with smaller gate electrodes to reduce parasitic capacitance effects. Reduced capacitive devices are preferred for higher speed circuit applications. To accommodate smaller gate electrodes, a conductive ZnO layer 68 is deposited on the substrate 66 first and unwanted portions of this layer are removed by masking and etching process steps known in the art and similar to those used above, as shown in FIG. 8A. Other transparent layers are then deposited on this structure in sequence, including an insulator layer 70, undoped ZnO channel layer 72, etch-stop layer 74, and conductive layer 76, as shown in FIG. 8B. The remaining fabrication steps of this TTFT are similar to those described above and shown in FIG. 8C and FIG. 8D.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of fabricating a transparent thin film transistor, the method comprising:
    depositing a plurality of layers on a substrate, the plurality of layers including a transparent conductive gate contact layer, a gate insulator layer, an undoped channel layer, an etch-stop layer, and a transparent conductive contact layer, wherein the etch-stop layer is positioned between the transparent conductive contact layer and the undoped channel layer;
    selectively removing a portion of the transparent conductive contact layer;
    preventing removal of a portion of the undoped channel layer by the etch-stop layer during the selective removal of the portion of the transparent conductive contact layer;
    selectively removing a portion of the etch-stop layer;
    converting an exposed portion of the etch-stop layer from a conductor to an insulator by oxidizing the exposed portion of the etch-stop layer in air;
    maintaining an unexposed portion of the etch-stop layer between the transparent conductive contact layer and the undoped channel layer as a conductor; and
    selectively removing a portion of remaining layers of the plurality of layers to form the transparent thin film transistor.

2. The method of claim 1, wherein the transparent conductive contact layer and the undoped channel layer include a metal-oxide semiconductor whose metal element is selected from a group consisting of: Zn, In, Sn, Ga, Hf, and combinations thereof.

3. The method of claim 2, wherein the metal-oxide semiconductor is ZnO.

4. The method of claim 1, wherein the etch-stop layer includes a metal selected from a group consisting of: Ti, Al, Cr, Si, Zr, Hf, Ni, and combinations thereof.

5. The method of claim 4, wherein the metal is Ti.

6. The method of claim 1, wherein selectively removing the portion of the transparent conductive contact layer comprises:
    applying a masking layer to the plurality of layers deposited on the substrate; and
    etching the transparent conductive contact layer in a wet chemical etch solution.

7. The method of claim 6, wherein the wet chemical etch solution includes hydrochloric acid and water.

8. The method of claim 1, wherein selectively removing the portion of the etch-stop layer comprises:
    etching the etch-stop layer by reactive ion etching in a mixture of $CF_4$ and $O_2$ gasses.

9. The method of claim 1, wherein converting the exposed portion of the etch-stop layer further comprises:
    annealing the exposed portion of the etch-stop layer in air or oxygen at an elevated temperature.

10. The method of claim 9, wherein the elevated temperature includes temperatures up to approximately 200° C.

11. A method of fabricating a thin film transistor from a plurality of layers deposited on a substrate, the plurality of layers including a transparent conductive gate contact layer, a gate insulator layer, an undoped channel layer, an etch-stop layer, and a transparent conductive contact layer, where the etch-stop layer is positioned between the transparent conductive contact layer and the undoped channel layer, the method comprising:
  selectively removing a portion of the transparent conductive contact layer;
  preventing removal of a portion of the undoped channel layer by the etch-stop layer during the selective removal of the portion of the transparent conductive contact layer;
  selectively removing a portion of the etch-stop layer;
  converting an exposed portion of the etch-stop layer from a conductor to an insulator by oxidizing the exposed portion of the etch-stop layer in air; and
  maintaining an unexposed portion of the etch-stop layer between the conductive contact layer and the undoped channel layer as a conductor.

12. The method of claim 11, further comprising:
  selectively removing a portion of remaining layers of the plurality of layers to form the thin film transistor.

13. The method of claim 11, wherein selectively removing the portion of the transparent conductive contact layer comprises:
  applying a masking layer to the plurality of layers deposited on the substrate; and
  etching the transparent conductive contact layer in a wet chemical etch solution.

14. The method of claim 13, wherein the wet chemical etch solution includes hydrochloric acid and water.

15. The method of claim 11, wherein selectively removing the portion of the etch-stop layer comprises:
  etching the etch-stop layer by reactive ion etching in a mixture of $CF_4$ and $O_2$ gasses.

16. The method of claim 11, wherein converting the exposed portion of the etch-stop layer further comprises:
  annealing the exposed portion of the etch-stop layer in air or oxygen at an elevated temperature.

17. The method of claim 16, wherein the elevated temperature includes temperatures up to approximately 400° C.

18. A method of fabricating a reduced parasitic capacitance transistor, the method comprising:
  depositing a transparent conductive gate contact layer on a substrate;
  selectively removing a portion of the transparent conductive gate contact layer leaving an etched gate contact layer;
  depositing a plurality of layers on the substrate and the etched gate contact layer, the plurality of layers including a gate insulator layer, an undoped channel layer, an etch-stop layer, and a transparent conductive contact layer, wherein the etch-stop layer is positioned between the transparent conductive contact layer and the undoped channel layer;
  selectively removing a portion of the transparent conductive contact layer;
  preventing removal of a portion of the undoped channel layer by the etch-stop layer during the selective removal of the portion of the transparent conductive contact layer;
  selectively removing a portion of the etch-stop layer;
  converting an exposed portion of the etch-stop layer from a conductor to an insulator by oxidizing the exposed portion of the etch-stop layer in air;
  maintaining an unexposed portion of the etch-stop layer between the conductive contact layer and the undoped channel layer as a conductor; and
  selectively removing a portion of remaining layers of the plurality of layers to form the transparent thin film transistor.

19. The method of claim 18, wherein the transparent conductive contact layer and the undoped channel layer include a metal-oxide semiconductor whose metal element is selected from a group consisting of: Zn, In, Sn, Ga, Hf, and combinations thereof.

20. The method of claim 18, wherein the etch-stop layer includes a metal selected from a group consisting of: Ti, Al, Cr, Si, Zr, Hf, Ni, and combinations thereof.

* * * * *